(12) United States Patent
Chen

(10) Patent No.: US 8,378,404 B2
(45) Date of Patent: Feb. 19, 2013

(54) SEMICONDUCTOR STRUCTURE OF A DISPLAY DEVICE AND METHOD FOR FABRICATING THE SAME

(75) Inventor: Yu-Cheng Chen, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 0 days.

(21) Appl. No.: 13/471,713

(22) Filed: May 15, 2012

(65) Prior Publication Data

US 2012/0223312 A1    Sep. 6, 2012

Related U.S. Application Data

(62) Division of application No. 12/815,513, filed on Jun. 15, 2010, now Pat. No. 8,202,770, which is a division of application No. 12/020,598, filed on Jan. 28, 2008, now abandoned.

(30) Foreign Application Priority Data

Apr. 20, 2007   (TW) ................................ 96114024 A

(51) Int. Cl.
*H01L 27/108* (2006.01)
(52) U.S. Cl. ................. 257/296; 257/535; 257/E29.343
(58) Field of Classification Search .................. 257/535, 257/E29.273, E21.411, E21.008, E21.616; 438/48, 55, 57, 59
See application file for complete search history.

(56) References Cited

U.S. PATENT DOCUMENTS

| | | | |
|---|---|---|---|
| 5,923,390 | A | 7/1999 | Jung Mok et al. |
| 6,140,162 | A | 10/2000 | Yeo |
| 6,576,504 | B2 | 6/2003 | Ohtani et al. |
| 6,690,031 | B1 | 2/2004 | Ohtani et al. |
| 7,704,810 | B2 | 4/2010 | Oue et al. |
| 2002/0105603 | A1 | 8/2002 | Yoo et al. |
| 2002/0117668 | A1 | 8/2002 | Kim |
| 2005/0218407 | A1 | 10/2005 | Matsuura et al. |
| 2008/0070351 | A1 | 3/2008 | Oue et al. |

FOREIGN PATENT DOCUMENTS

JP   2006251093   9/2006

*Primary Examiner* — Wael Fahmy
*Assistant Examiner* — Sarah Salerno
(74) *Attorney, Agent, or Firm* — McClure, Qualey & Rodack, LLP

(57) ABSTRACT

A semiconductor structure of a display device and the method for fabricating the same are provided. The semiconductor structure is formed on a substrate having a TFT region and a pixel capacitor region thereon. A TFT, including a gate electrode, a source electrode, a drain electrode, a channel layer, and a gate insulating layer, is formed on the TFT region of the substrate. A pixel capacitor is formed on the pixel capacitor region, wherein the pixel capacitor comprises a bottom electrode formed on a bottom dielectric layer, an interlayer dielectric layer formed on the bottom electrode, a top electrode formed on the interlayer dielectric layer, a contact plug passing through the interlayer dielectric layer and electrically connected to the top and bottom electrodes, a capacitor dielectric layer formed on the top electrode, a transparent electrode formed on the capacitor dielectric layer and electrically connected to the drain electrode.

9 Claims, 6 Drawing Sheets

SEMICONDUCTOR STRUCTURE OF A DISPLAY DEVICE AND METHOD FOR FABRICATING THE SAME

CROSS REFERENCE TO RELATED APPLICATIONS

This is a divisional application of patent application Ser. No. 12/815,513 filed on Jun. 15, 2010, now allowed, which is a divisional application of patent application Ser. No. 12/020,598, filed on Jan. 28, 2008. The prior application Ser. No. 12/020,598 claims the benefit of Taiwan Patent Application No. 096114024 filed on Apr. 20, 2007, the disclosures of which are incorporated herein by reference in their entirety.

BACKGROUND OF THE INVENTION

1. Field of the Invention

The invention relates to a display device and method for fabricating the same and more particularly to a pixel capacitor structure of a display device and method for fabricating the same.

2. Description of the Related Art

With increasing resolution of LCDs, it has become important to increase the aperture ratio of each pixel for improved performance. To increase the aperture ratio, the plane area of the storage capacitor must be reduced, and the occupied area of pixel electrodes must be enlarged as much as possible. Nevertheless, for TFT-LCD displays, as resolution increases, requirements for reducing the pixel size and plane area of the storage capacitor result in problems such as flickering, low color contrast and cross-talk.

Accordingly, a new structure capable of increasing storage capacitance without sacrificing the aperture ratio of a pixel, or maintaining the storage capacitance while increasing the aperture ratio of a pixel is desirable.

BRIEF SUMMARY OF THE INVENTION

An exemplary embodiment a semiconductor structure of a display device comprises: a substrate with a thin film transistor region and a pixel capacitor region; a thin film transistor, a source electrode plug and a drain electrode plug formed on the thin film transistor region of the substrate, wherein the thin film transistor comprises a gate electrode, a source electrode, a drain electrode, a channel, and a gate dielectric layer, and the source electrode plug and the drain electrode plug electrically connected to the source electrode and the drain electrode, respectively; and a pixel capacitor formed on the pixel capacitor region of the substrate, wherein the pixel capacitor comprises a bottom electrode formed on a bottom dielectric layer, an interlayer dielectric layer formed on the substrate and the bottom electrode, a top electrode formed on the interlayer dielectric layer, wherein the top electrode electrically connects to the bottom electrode, a capacitor dielectric layer formed on the substrate and the top electrode, and a transparent electrode formed on the capacitor dielectric layer over the top electrode and electrically connected to the drain electrode plug.

According to another embodiment of the invention, a pixel capacitor structure comprises: a semiconductor layer formed on a substrate; a bottom dielectric layer formed on the semiconductor layer; a bottom electrode formed on the bottom dielectric layer; an interlayer dielectric layer formed on the bottom electrode; a top electrode formed on the dielectric layer and electrically connected to the bottom electrode via a first plug, wherein the first plug passes through the interlayer dielectric layer; a capacitor dielectric layer formed on the top electrode; a planarization layer formed on the capacitor dielectric layer and an opening exposing the capacitor dielectric layer directly over the top electrode; and a transparent electrode formed on the capacitor dielectric layer directly over the top electrode, wherein the transparent electrode electrically connects to the semiconductor layer via a second plug.

Methods for fabricating a semiconductor structure of a display device are provided. An exemplary embodiment of a method for fabricating the semiconductor structure of the display device comprises: providing a substrate with a thin film transistor region and a pixel capacitor region; forming a first semiconductor layer on the thin film transistor region of the substrate; forming a gate dielectric layer on the substrate; forming a gate electrode on the gate dielectric layer within the thin film transistor region and a bottom electrode on the gate dielectric layer within the pixel capacitor region; performing a heavily doped ion implantation on the first semiconductor layer to form a source electrode and a drain electrode, and performing a light doped ion implantation on the first semiconductor layer to form a light doped region, wherein the undoped first semiconductor layer is defined as a channel region; forming an interlayer dielectric layer on the substrate; forming first and second contact holes respectively exposing the source electrode and the drain electrode and a third contact hole exposing the bottom electrode; forming a source electrode plug and a drain electrode plug passing through the first and second contact holes to electrically contact the source electrode and the drain electrode, respectively; forming a top electrode electrically contacted to the bottom electrode via the third contact hole; sequentially forming a capacitor dielectric layer and a planarization layer on the substrate; patterning the capacitor dielectric layer and the planarization layer to form a fourth contact hole passing through the capacitor dielectric layer and the planarization layer exposing the drain electrode plug and an opening passing through the planarization layer exposing the capacitor dielectric layer directly over the top electrode; and forming a pixel electrode filled the fourth contact hole and the opening and electrically connected to the drain electrode.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

FIGS. 1a to 1i show the steps of a method for fabricating a semiconductor structure of a display device according to an embodiment of the invention.

Figure 1A:
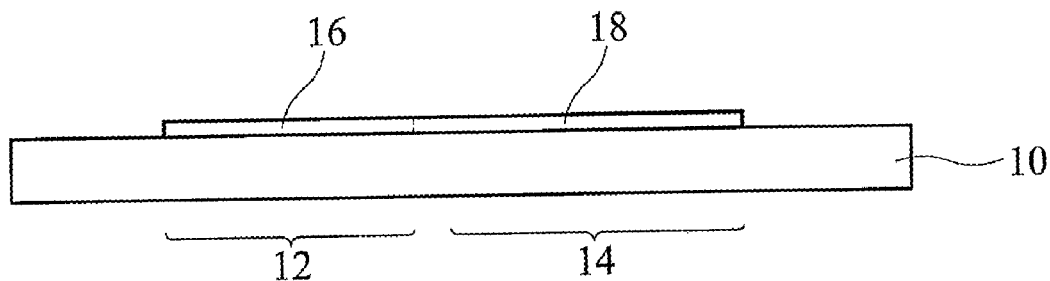
FIGS. 1a-1i are sectional diagrams of the method for fabricating a semiconductor structure of display device according to an embodiment of the invention.

First, referring to FIG. 1a, a substrate 10 with thin film transistor region 12 and a pixel capacitor region 14 is provided. The substrate 10 can be transparent substrate, such as glass substrate or plastic substrate. The substrate 10 has a first semiconductor layer 16 on the thin film transistor region 12 and a second semiconductor layer 18 on the pixel capacitor region 14. The first semiconductor layer 16 and the second semiconductor layer 18 can be of the same material and formed by the same process. Suitable materials of the first and second semiconductor layers can be polycrystalline silicon or amorphous silicon.

Figure 1B:
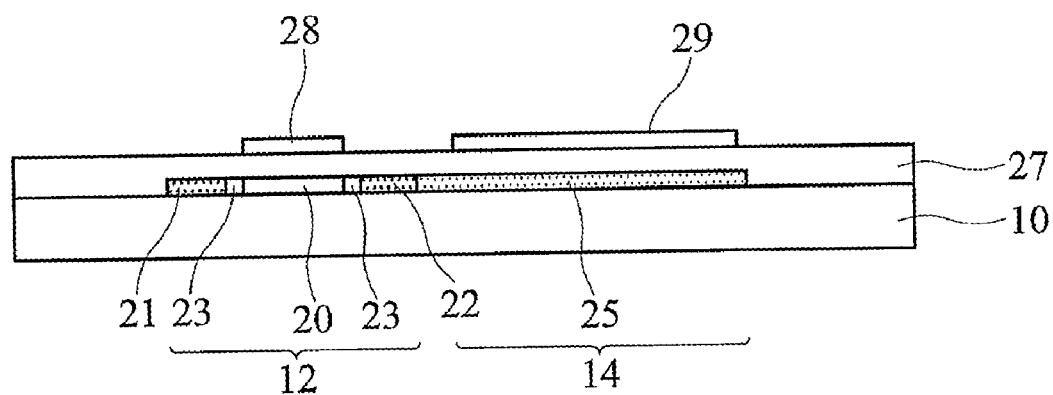

Next, referring to FIG. 1b, a heavily doped ion implantation is performed to the first semiconductor layer 16 to form a source electrode (heavily doped region) 21, a drain electrode (heavily doped region) 22. Next, a gate dielectric layer 27 (bottom dielectric layer) is blanketly formed on the substrate 10, and a gate electrode 28 is formed on the gate dielectric layer 27 over a channel region. It should be noted that the plane area of the gate electrode 28 is smaller than that of the channel region 20. A conductive layer is formed on the gate dielectric layer 27 of the pixel capacitor region 14, serving as a bottom electrode 29. Next, a lightly doped ion implantation is performed to the first semiconductor layer 16 to form lightly doped regions 23. Further, when performing the heavily doped ion implantation on the first semiconductor layer 16, the second semiconductor layer 18 is simultaneously subjected to the heavily doped ion implantation to form a heavily doped semiconductor layer 25. In an embodiment of the invention, the source electrode 21, the drain electrode 22, and the heavily doped semiconductor layer 25 are formed by heavily doped ion implantation with one photo-mask. The lightly doped regions 23 are formed by lightly doped ion implantation with the gate electrode 28 serving as a mask.

Further, in another embodiment of the invention, the source electrode 21 and drain electrode 22 can be formed by heavily doped ion implantation with the gate electrode 28 as mask. After performing the heavily doped ion implantation, the gate electrode 28 is etched to be reduced and the first semiconductor layer is subjected to a lightly doped ion implantation with the reduced gate electrode 28 serving as a mask. The gate electrode 28 and the bottom electrode 29 are of the same material and formed by the same process. Suitable materials of the gate electrode 28 and the bottom electrode 29 can be Mo, W, Al, Ti, Cr, and combinations thereof The gate dielectric layer 27 comprises a dielectric layer, with a material such as silicon oxide, with a thickness between 50 nm~200 nm, for example 100 nm.

Figure 1C:
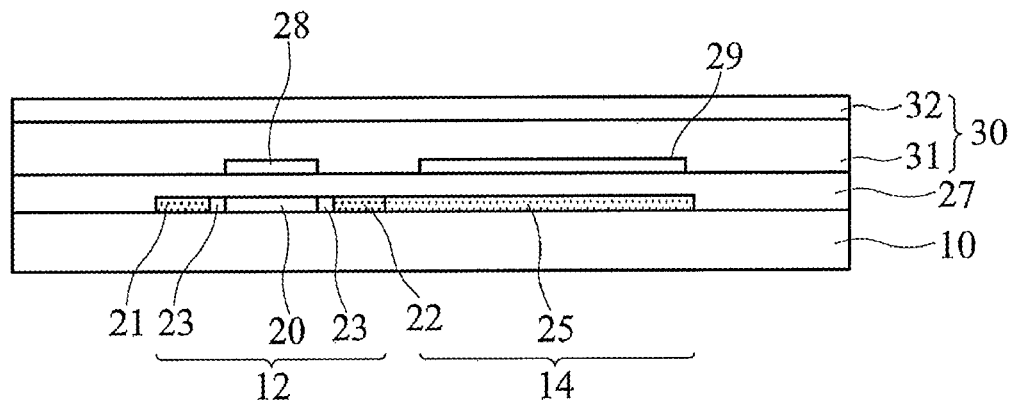

Next, referring to FIG. 1c, an interlayer dielectric layer 30 is blanketly formed on the substrate 10. The interlayer dielectric layer 30 can comprise a first dielectric layer 31 and a second dielectric layer 32, wherein the first dielectric layer 31 can be silicon oxide or silicon nitride with a thickness between 50 nm to 300 nm, and the second dielectric layer 32 can silicon oxide or silicon nitride with a thickness between 50 nm to 300 nm.

Figure 1D:
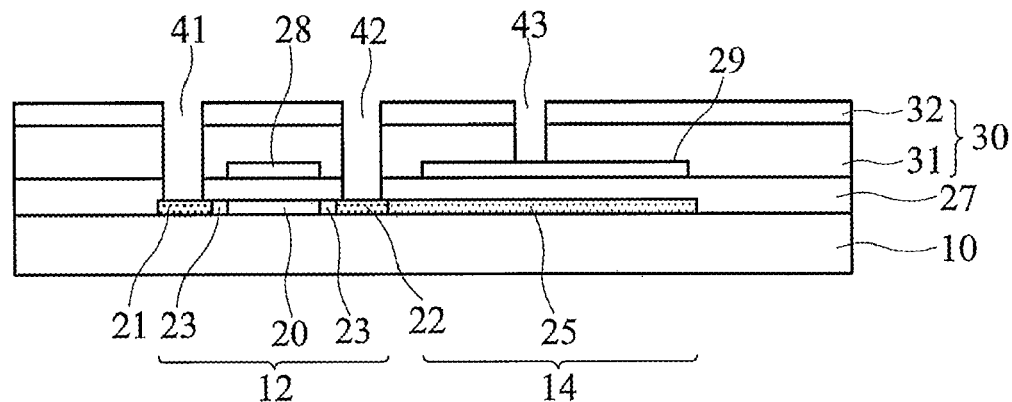

Next, referring to FIG. 1d, the interlayer dielectric layer 30 and the gate dielectric layer 27 are patterned to form a first contact hole 41 and a second contact hole 42 passing through the interlayer dielectric layer 30 and the gate dielectric layer 27 respectively exposing the source electrode 21 and the drain electrode 22, and a third contact hole 43 passing through the dielectric layer 30 exposing the surface of the bottom electrode 29.

Figure 1E:
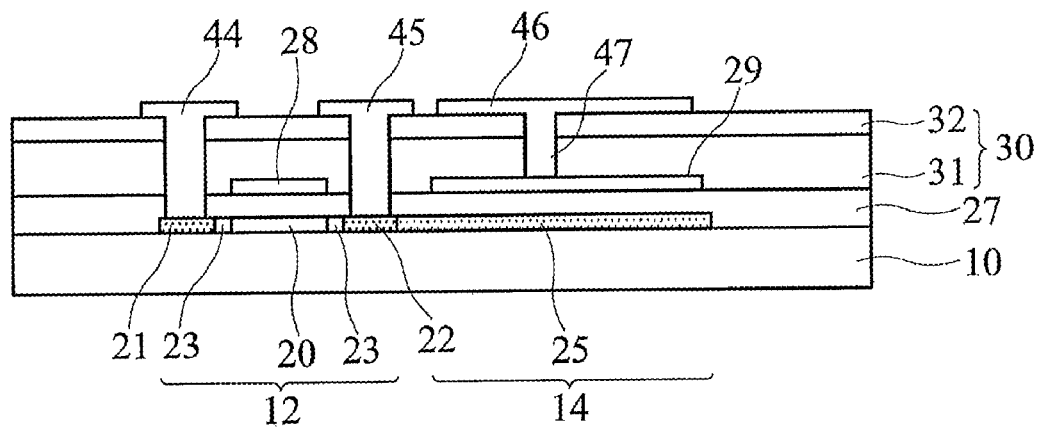
Figure 1F:
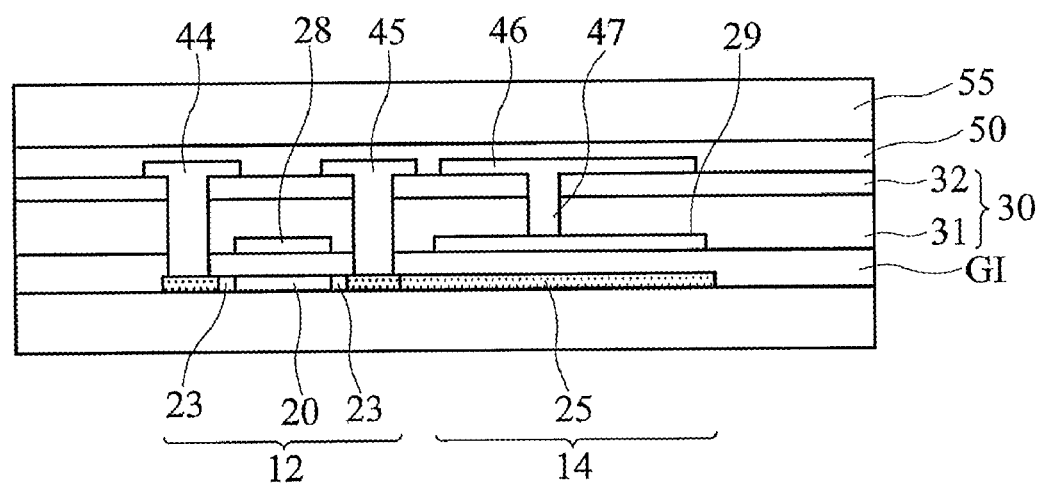

Next, referring to FIG. 1e, a conductive layer (not shown) is formed on the substrate 10 and fills the first contact hole 41, the second contact hole 42, and the third contact hole 43. Next, the conductive layer is patterned to form a source line (not shown), a source electrode plug 44 and a drain electrode plug 45, respectively, electrically connected to the source electrode 21 and drain electrode 22 via the first and second contact hole 41 and 42. A top electrode 46 is simultaneously formed and, electrically connects through the third contact hole 43 to the bottom electrode 29 via the plug 47. The bottom electrode 29 and the top electrode 46 comprises a first capacitor electrode with a first electric potential. The top electrode 46 and the bottom electrode 29 can be the same or different material and comprises Mo (molybdenum), W (tungsten), Al (aluminum), Ti (titanium), Cr (chromium), alloy, or multi-layer structure thereof Next, referring to FIG. 1f, a capacitor dielectric layer 50 and a planarization layer 55 are formed on the substrate 10. The capacitor dielectric layer 50 can be dielectric material, such as oxide-containing silicon, nitride-containing silicon, or multi-layer structure with a thickness between 50 nm to 200 nm, for example 100 nm. The planarization layer 55 can be organic material, such as polymer material, with a thickness of 2000 nm~4000 nm and formed by spin-coating, printing or screen printing.

Figure 1G:
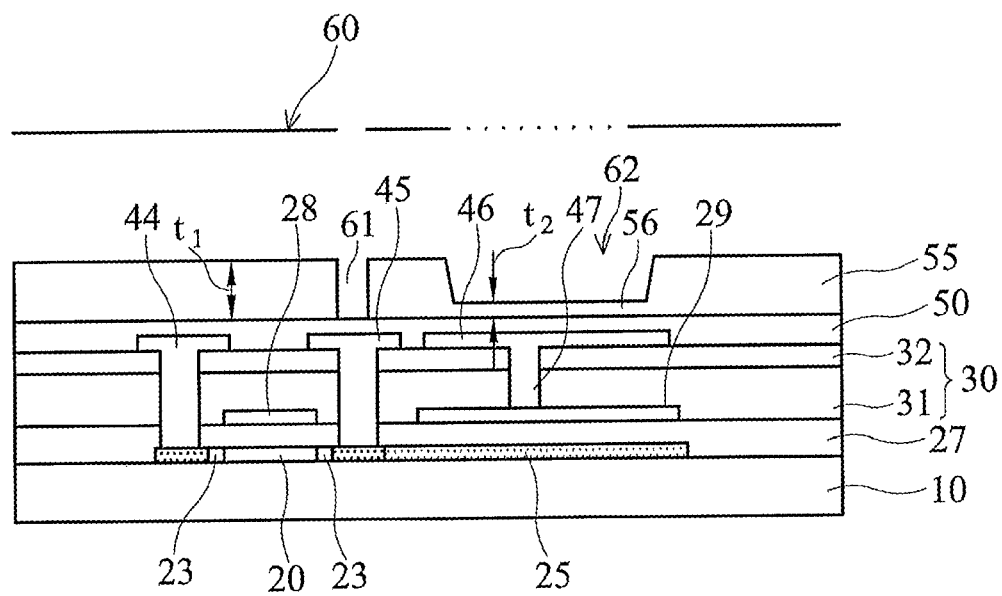

Next, referring to FIG. 1g, the planarization layer 55 is patterned by a photo-mask to form a fourth contact hole 61 over the drain electrode plug 45 and a first opening 62 over the top electrode 46. It should be noted that the patterned planarization layer 55 has different thicknesses. The planarization layer 55 over the drain electrode plug 45 is completely removed to form a contact hole 61 exposing the capacitor dielectric layer 50 over the drain electrode plug 45. The unpatterned planarization layer 55 has a first thickness t1. The planarization layer 55 on the top electrode 46 is partially removed to remain a planarization layer 56 with a second thickness t2. Herein, the first thickness t1 can be between 2000 nm~4000 nm, and the second thickness t2 can be 200 nm~~500 nm. The photo-mask for forming the fourth contact hole 61 and the first opening 62 can be a halftone mask or Gray-tone mask.

Figure 1H:
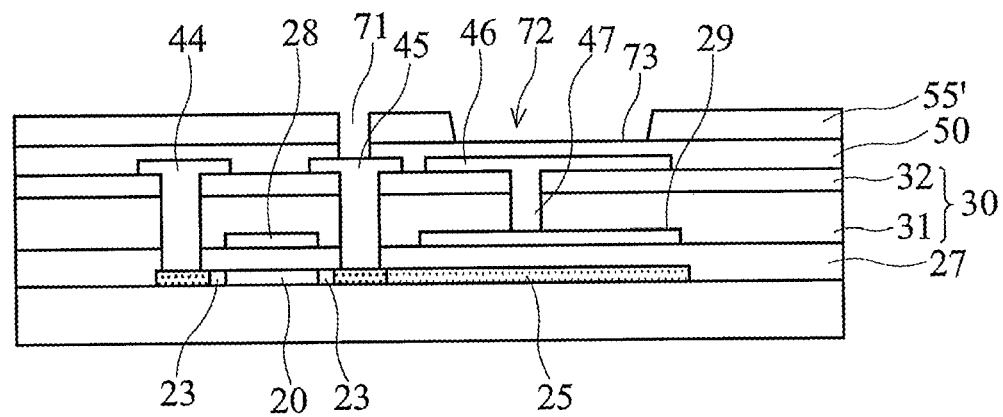

Next, referring to FIG. 1h, the capacitor dielectric layer 50 and the planarization layer 55 are etched by anisotropic etching with the patterned planarization layer 55 serving as a mask, forming a fifth contact hole 71 passing through the capacitor dielectric layer 50 and the planarization layer 55 exposing the drain electrode plug 45, and a second opening 72 passing through the planarization layer 55 exposing the surface 73 of the capacitor dielectric layer 50 formed on the top electrode 46. The planarization layer 56 with the second thickness t2 can be removed during the anisotropic etching procedure, and the planarization layer 55 with the first thickness can be etched so that the planarization layer 55' on the capacitor dielectric layer 50 outside the fifth contact hole 71 and the second opening 72 remains.

Figure 1I:
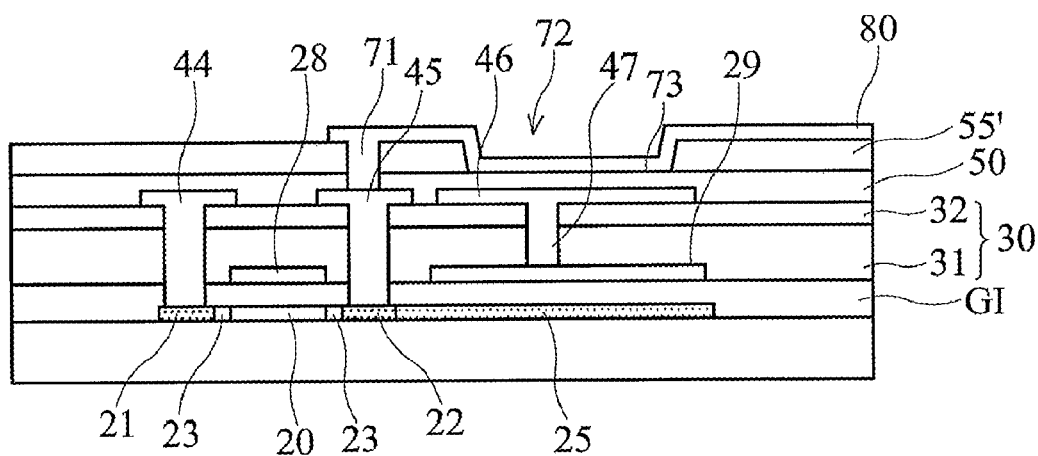

Finally, referring to FIG. 1i, a transparent conductive layer is formed on the capacitor dielectric layer 50 and filled into the fifth contact hole 71 and the second opening 72, serving as pixel electrode 80, thus fabrication of a semiconductor structure of a display device with high capacity storage is completed, requiring at least six photolithography steps according to the embodiment. Specifically, the pixel electrode 80 is electrically connected to the drain electrode 22 via the drain electrode plug 45. It should be noted that the pixel electrode 80 formed in the second opening 72 and the heavily doped second semiconductor layer 25 comprises a second capacitor electrode with a second electrical potential. The transparent electrode can comprise ITO (indium tin oxide), IZO (indium zinc oxide), AZO (aluminum zinc oxide), ZnO (zinc oxide), GaN (gallium nitride), GaInN (gallium indium nitride), CdS (cadmium sulfide), ZnS (zinc sulfide), CdSe (cadmium selenide), or ZnSe (zinc selenide).

Still referring to FIG. 1i, the pixel capacitor of the invention can comprise: a second semiconductor layer 25 formed on the substrate 10; a bottom dielectric layer (gate dielectric layer) 27 formed on the second semiconductor layer 27; a bottom electrode 29 formed on the bottom dielectric layer 27; an interlayer dielectric layer 30 formed on the bottom electrode 29; a plug 47 passing through the dielectric layer 30 and contact to bottom electrode 29; a top electrode 46 formed on the dielectric layer 30 and electrically connected to the bottom electrode 29 via the plug 47; the capacitor dielectric layer 50 formed on the top electrode 46; the planarization layer 55 formed on the capacitor dielectric layer 50 with a second opening 72 exposing the capacitor dielectric layer 50 directly over the top electrode 46; and the transparent electrode 80 formed on the capacitor dielectric layer 50 over the top electrode 46, wherein the transparent electrode 80 electrically connects to the drain electrode 22 and the second semiconductor layer 25 via the drain electrode plug 45.

It should be noted that the pixel capacitor comprises a pixel electrode, thereby increasing the capacity storage without reducing the area of the display area (pixel electrode area). Further, the first capacitor electrode and the second capacitor electrode comprise two capacitors in different locations. Therefore, the capacity storage can be increased and the aperture rate of the pixel electrode can be kept. Moreover, a heavily doped semiconductor layer can be simultaneously formed to increase capacity storage of the capacitor when forming the source electrode and drain electrode by heavily doped ion implantation.

Figure 2:
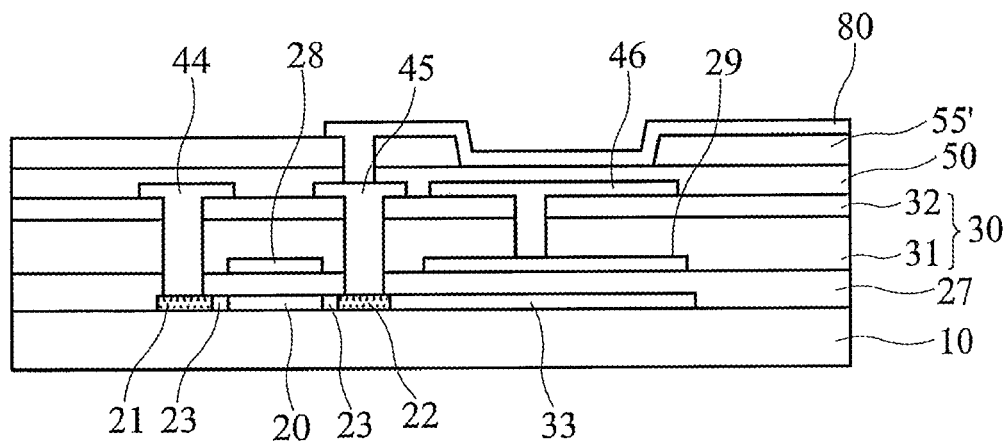
FIG. 2 is a sectional diagram of a semiconductor structure of a display device according to another embodiment of the invention.
Figure 3:
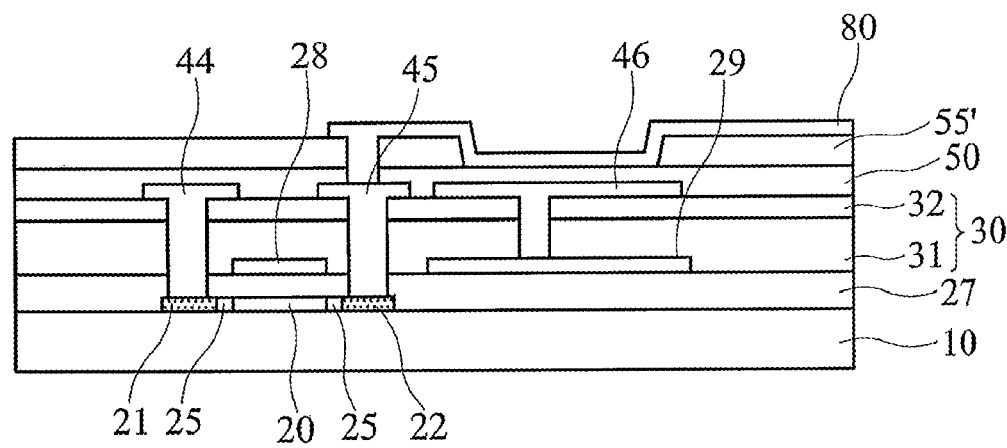
FIG. 3 is a sectional diagram of a semiconductor structure of a display device according to yet another embodiment of the invention.

According to another embodiment of the invention, referring to FIG. 2, the second semiconductor layer can also be an undoped semiconductor layer 33, and the thickness and material of the capacitor dielectric layer 50 can be modified to increase capacity storage. Further, according to yet another embodiment of the invention, referring to FIG. 3, the pixel capacitor can also only consist of the top electrode 46 and the pixel electrode 80, and the thickness and material of the capacitor dielectric layer 50 can be modified to increase capacity storage.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure of display device, comprising:
   a substrate with a thin film transistor region and a pixel capacitor region;
   a semiconductor layer including a first semiconductor portion on the thin film transistor region of the substrate and a second semiconductor portion on the pixel capacitor region of the substrate;
   a gate dielectric layer covering the semiconductor layer and the substrate;
   a gate electrode formed on the gate dielectric layer above the first semiconductor portion within the thin film transistor region, wherein the first semiconductor portion including a channel region under the gate, and a source electrode and a drain electrode located at two opposite sides of the channel region;
   a bottom electrode formed on the gate dielectric layer above the second semiconductor portion within the pixel capacitor region;
   an interlayer dielectric layer covering the gate electrode, the bottom electrode and the gate dielectric layer, the interlayer dielectric layer including a first contact hole, a second contact hole and a third contact hole, the first contact hole and the second contact hole being respectively exposing the source electrode and the drain electrode, and the third contact hole being exposing the bottom electrode;
   a source electrode plug and a drain electrode plug being electrically contacted to the source electrode and the drain electrode via the first contact hole and the second contact hole respectively;
   a top electrode being electrically contacted to the bottom electrode via the third contact hole, wherein there is no intermediate electrode between the top electrode and the bottom electrode;
   a capacitor dielectric layer and a planarization layer covering the source electrode plug, drain electrode plug, the top electrode and the interlayer dielectric layer, wherein the capacitor dielectric layer and the planarization layer include a fourth contact hole passing through the capacitor dielectric layer and the planarization layer exposing the drain electrode plug and an opening passing through the planarization layer exposing the capacitor dielectric layer over the top electrode; and
   a pixel electrode formed on the capacitor dielectric layer within the opening and electrically connected to the drain electrode by filled in the fourth contact hole.

2. The semiconductor structure of display device as claimed in claim 1, wherein the second semiconductor portion of the semiconductor layer comprises a heavily doped semiconductor layer.

3. The semiconductor structure of display device as claimed in claim 1, wherein a material of the dielectric layer comprises oxide-containing silicon, nitride-containing silicon, and a combination thereof.

4. The semiconductor structure of display device as claimed in claim 1, wherein a material of the transparent electrode comprises ITO, IZO, AZO, ZnO, GaN, GaInN, CdS, ZnS, CdSe, or ZnSe.

5. The semiconductor structure of display device as claimed in claim 1, wherein a material of the top electrode and the bottom electrode comprises Mo, W, Al, Ti, Cr, and combinations thereof.

6. The semiconductor structure of display device as claimed in claim 1, wherein the gate electrode and the bottom electrode are made of the same layer.

7. The semiconductor structure of display device as claimed in claim 1, wherein the source electrode plug, the drain electrode plug and the top electrode are made of the same layer.

8. The semiconductor structure of display device as claimed in claim 1, wherein the top electrode and bottom electrode construct a first capacitor electrode.

9. The semiconductor structure of display device as claimed in claim 1, wherein the second semiconductor portion and the pixel electrode construct a second capacitor electrode.

* * * * *